(12) United States Patent
Hwang et al.

(10) Patent No.: US 7,440,392 B2
(45) Date of Patent: Oct. 21, 2008

(54) WIRELESS RECEIVER DEINTERLEAVER HAVING PARTITIONED MEMORY

(75) Inventors: Chien-Meen Hwang, San Jose, CA (US); Peter Chan, Fremont, CA (US); Howard Hicks, San Francisco, CA (US); Chih (Rex) Hsueh, Cupertino, CA (US); Liping Zhang, Los Angeles, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 988 days.

(21) Appl. No.: 10/367,864

(22) Filed: Feb. 19, 2003

(65) Prior Publication Data
US 2004/0162931 A1 Aug. 19, 2004

(51) Int. Cl.
H04J 11/00 (2006.01)
(52) U.S. Cl. ........................ 370/208; 375/130
(58) Field of Classification Search ................ None
See application file for complete search history.

(56) References Cited

U.S. PATENT DOCUMENTS

| 5,535,220 | A  | * | 7/1996 | Kanno et al. .............. 714/701 |
| 5,737,252 | A  | * | 4/1998 | Hollmann et al. ........... 708/254 |
| 6,381,728 | B1 | * | 4/2002 | Kang ........................ 714/781 |
| 6,434,203 | B1 | * | 8/2002 | Halter ....................... 375/341 |
| 6,628,730 | B1 | * | 9/2003 | Stott et al. ................. 375/344 |
| 6,754,290 | B1 | * | 6/2004 | Halter ....................... 375/340 |
| 7,170,849 | B1 | * | 1/2007 | Arivoli et al. .............. 370/208 |

OTHER PUBLICATIONS

Horvath et al., "A Novel, High-Speed, Reconfigurable Demapper—Symbol Deinterleaver Architecture For DVB-T", *Circuits and Systems*, 1999, ISCAS '99, Proceedings of the 1999 IEEE International Symposium on Orlando, FL, USA May 30-Jun. 2, 1999, Paged 382-385.

IEEE Std. 802.11a-1999, "Part 11: Wireless LAN Medium Access Control (MAC) and Physical Layer (PHY) specifications: High-speed Physical Layer in the 5 GHZ Band", L.AN/MAN Standards Committee of the IEEE Computer Society, IEEE-SA Standards Board, Approved Sep. 16, 1999, New York, USA.

* cited by examiner

*Primary Examiner*—Toan D. Nguyen
(74) *Attorney, Agent, or Firm*—Manelli Denison & Selter PLLC; Leon R. Turkevich (57) ABSTRACT

A deinterleaver module in an OFDM wireless transceiver includes partitioned memory banks for storage of code word fragments from an interleaved data stream, each code word fragment associated with a prescribed subcarrier frequency. Each code word fragment includes a prescribed number of code word bits based on a prescribed modulation of the interleaved data stream, and the code word bits for each code word fragment are written into respective selected locations of the corresponding memory bank based on the prescribed modulation and the corresponding prescribed subcarrier frequency. The deinterleaver module outputs deinterleaved data from the memory banks based on parallel output of the respective stored code word bits from a selected address of the memory banks.

16 Claims, 10 Drawing Sheets

| addr | bank 0 | bank 1 | bank 2 | bank 3 |
|---|---|---|---|---|
| 0x0 | 190a 38.1 | 41.1 | 45.1 | 48.1 |
| 0x1 | 51.1 | 54.1 | 190e 58.1 | 61.1 |
| 0x2 | 190c 1.1 | 4.1 | 8.1 | 11.1 |
| 0x3 | 14.1 | 17.1 | 20.1 | 24.1 |
| 0x4 | 38.2 | 41.2 | 190f 45.2 | 48.2 |
| 0x5 | 190b 51.2 | 54.2 | 58.2 | 61.2 |
| 0x6 | 2.1 | 190d 4.2 | 8.2 | 11.2 |
| 0x7 | 14.2 | 17.2 | 20.2 | 24.2 |
| 0x8 | 39.1 | 42.1 | 46.1 | 49.1 |
| 0x9 | 52.1 | 55.1 | 59.1 | 62.1 |
| 0xa | 2.1 | 5.1 | 9.1 | 12.1 |
| 0xb | 15.1 | 18.1 | 22.1 | 25.1 |
| 0xc | 39.2 | 42.2 | 46.2 | 49.2 |
| 0xd | 52.2 | 55.2 | 59.2 | 62.2 |
| 0xe | 2.2 | 5.2 | 9.2 | 12.2 |
| 0xf | 15.2 | 18.2 | 22.2 | 25.2 |
| 0x10 | 40.1 | 44.1 | 47.1 | 50.2 |
| 0x11 | 53.1 | 56.1 | 60.1 | 63.1 |
| 0x12 | 3.1 | 6.1 | 10.1 | 13.1 |
| 0x13 | 16.1 | 19.1 | 23.1 | 26.1 |
| 0x14 | 40.2 | 44.2 | 47.2 | 50.2 |
| 0x15 | 53.2 | 56.2 | 60.2 | 63.2 |
| 0x16 | 3.2 | 6.2 | 10.2 | 13.2 |
| 0x17 | 16.2 | 19.2 | 23.2 | 26.2 |

Figure 7B

|  | ↙ 100a | ↙ 100b | ↙ 100c | ↙ 100d |
|---|---|---|---|---|
| addr | bank 0 | bank 1 | bank 2 | bank 3 |
| 0x0 | 190g — (38.1) | 190k — (41.2) | 45.1 | 48.2 |
| 0x1 | 51.1 | 54.2 | 58.1 | 61.2 |
| 0x2 | 1.1 | 4.2 | 8.1 | 11.2 |
| 0x3 | 14.1 | 17.2 | 20.1 | 24.2 |
| 0x4 | 190h — (38.2) | 190l — (41.1) | 45.2 | 48.2 |
| 0x5 | 51.2 | 54.1 | 58.2 | 61.1 |
| 0x6 | 1.2 | 4.1 | 8.2 | 11.1 |
| 0x7 | 14.2 | 17.1 | 20.2 | 24.1 |
| 0x8 | 190i — (38.3) | 190m — (41.4) | 45.3 | 48.4 |
| 0x9 | 51.3 | 54.4 | 58.3 | 61.4 |
| 0xa | 1.3 | 4.4 | 8.3 | 11.4 |
| 0xb | 14.3 | 17.4 | 20.3 | 24.4 |
| 0xc | 190j — (38.4) | 190n — (41.3) | 45.4 | 48.3 |
| 0xd | 51.4 | 54.3 | 58.4 | 61.3 |
| 0xe | 1.4 | 4.3 | 8.4 | 11.3 |
| 0xf | 14.4 | 17.3 | 20.4 | 24.3 |
| 0x10 | 39.1 | 42.2 | 46.1 | 49.2 |
| 0x11 | 52.1 | 55.2 | 59.1 | 62.2 |
| 0x12 | 2.1 | 5.2 | 9.1 | 12.2 |
| 0x13 | 15.1 | 18.2 | 22.1 | 25.2 |
| 0x14 | 39.2 | 42.1 | 46.2 | 49.1 |
| 0x15 | 52.2 | 55.1 | 59.2 | 62.1 |
| 0x16 | 2.2 | 5.1 | 9.2 | 12.1 |
| 0x17 | 15.2 | 18.1 | 22.2 | 25.1 |
| 0x18 | 39.3 | 42.4 | 46.3 | 49.4 |
| 0x19 | 52.3 | 55.4 | 59.3 | 62.4 |
| 0x1a | 2.3 | 5.4 | 9.3 | 12.4 |
| 0x1b | 15.3 | 18.4 | 22.3 | 25.4 |
| 0x1c | 39.4 | 42.3 | 46.4 | 49.3 |
| 0x1d | 52.4 | 55.3 | 59.4 | 62.3 |
| 0x1e | 2.4 | 5.3 | 9.4 | 12.3 |
| 0x1f | 15.4 | 18.3 | 22.4 | 25.3 |
| 0x20 | 40.1 | 44.2 | 47.1 | 50.3 |
| 0x21 | 53.1 | 56.2 | 60.1 | 63.2 |
| 0x22 | 3.1 | 6.2 | 10.1 | 13.2 |
| 0x23 | 16.1 | 19.2 | 23.1 | 26.2 |
| 0x24 | 40.2 | 44.1 | 47.2 | 50.1 |
| 0x25 | 53.2 | 56.1 | 60.2 | 63.1 |
| 0x26 | 3.2 | 6.1 | 10.2 | 13.1 |
| 0x27 | 16.2 | 19.1 | 23.2 | 26.1 |
| 0x28 | 40.3 | 44.4 | 47.3 | 50.4 |
| 9x29 | 53.3 | 56.4 | 60.3 | 63.4 |
| 0x2a | 3.3 | 6.4 | 10.3 | 13.4 |
| 0x2b | 16.3 | 19.4 | 23.3 | 26.4 |
| 0x2c | 40.4 | 44.3 | 47.4 | 50.3 |
| 0x2d | 53.4 | 56.3 | 60.4 | 63.3 |
| 0x2e | 4.4 | 6.3 | 10.4 | 13.3 |
| 0x2f | 16.4 | 19.3 | 23.4 | 26.3 |

Figure 7C

| addr | bank 0 | bank 1 | bank 2 | bank 3 |
|---|---|---|---|---|
| 0x0 | 38.1 | 41.3 | 45.2 | 48.1 |
| 0x1 | 51.3 | 54.2 | 58.1 | 61.3 |
| 0x2 | 1.2 | 4.1 | 8.3 | 11.2 |
| 0x3 | 14.1 | 17.3 | 20.2 | 24.1 |
| 0x4 | 38.2 | 41.1 | 45.3 | 48.2 |
| 0x5 | 51.1 | 54.3 | 58.2 | 61.1 |
| 0x6 | 1.3 | 4.2 | 8.1 | 11.3 |
| 0x7 | 14.2 | 17.1 | 20.3 | 24.2 |
| 0x8 | 38.3 | 41.2 | 45.1 | 48.3 |
| 0x9 | 51.2 | 54.1 | 58.3 | 61.2 |
| 0xa | 1.1 | 4.3 | 8.2 | 11.1 |
| 0xb | 14.3 | 17.2 | 20.1 | 24.3 |
| 0xc | 38.4 | 41.6 | 45.5 | 48.4 |
| 0xd | 51.6 | 54.5 | 58.4 | 61.6 |
| 0xe | 1.5 | 4.4 | 8.6 | 11.5 |
| 0xf | 14.4 | 17.6 | 20.5 | 24.4 |
| 0x10 | 38.5 | 41.4 | 45.6 | 48.5 |
| 0x11 | 51.4 | 54.6 | 58.5 | 61.4 |
| 0x12 | 1.6 | 4.5 | 8.4 | 11.6 |
| 0x13 | 14.5 | 17.4 | 20.6 | 24.5 |
| 0x14 | 38.6 | 41.5 | 45.4 | 48.6 |
| 0x15 | 51.5 | 54.4 | 58.6 | 61.5 |
| 0x16 | 1.4 | 4.6 | 8.5 | 11.4 |
| 0x17 | 14.6 | 17.5 | 20.4 | 24.6 |
| 0x18 | 39.1 | 42.3 | 46.2 | 49.1 |
| 0x19 | 52.3 | 55.2 | 59.1 | 62.3 |
| 0x1a | 2.2 | 5.1 | 9.3 | 12.2 |
| 0x1b | 15.1 | 18.3 | 22.2 | 25.1 |
| 0x1c | 39.2 | 42.1 | 46.3 | 49.2 |
| 0x1d | 52.1 | 55.3 | 59.2 | 62.1 |
| 0x1e | 2.3 | 5.2 | 9.1 | 12.3 |
| 0x1f | 15.2 | 18.1 | 22.3 | 25.2 |
| 0x20 | 39.3 | 42.2 | 46.1 | 49.3 |
| 0x21 | 52.2 | 55.1 | 59.3 | 62.2 |
| 0x22 | 2.1 | 5.3 | 9.2 | 12.1 |
| 0x23 | 15.3 | 18.2 | 22.1 | 25.3 |
| 0x24 | 39.4 | 42.6 | 46.5 | 49.4 |
| 0x25 | 52.6 | 55.5 | 59.4 | 62.6 |
| 0x26 | 3.5 | 5.4 | 9.6 | 12.5 |
| 0x27 | 15.4 | 18.6 | 22.5 | 25.4 |
| 0x28 | 39.5 | 42.4 | 46.6 | 49.5 |
| 9x29 | 52.4 | 55.6 | 59.5 | 62.4 |
| 0x2a | 2.6 | 5.5 | 9.4 | 12.6 |
| 0x2b | 15.5 | 18.4 | 22.6 | 25.5 |
| 0x2c | 39.6 | 42.5 | 46.4 | 49.6 |
| 0x2d | 52.5 | 55.4 | 59.6 | 62.5 |
| 0x2e | 2.4 | 5.6 | 9.5 | 12.4 |
| 0x2f | 15.6 | 18.5 | 22.4 | 25.6 |

| addr | bank 0 | bank 1 | bank 2 | bank 3 |
|---|---|---|---|---|
| 0x30 | 40.1 | 44.3 | 47.2 | 50.1 |
| 0x31 | 53.3 | 56.2 | 60.1 | 63.3 |
| 0x32 | 3.2 | 6.1 | 10.3 | 13.2 |
| 0x33 | 16.1 | 19.3 | 23.2 | 26.1 |
| 0x34 | 40.2 | 44.1 | 47.3 | 50.2 |
| 0x35 | 53.1 | 56.3 | 60.2 | 63.1 |
| 0x36 | 3.3 | 6.2 | 10.1 | 13.3 |
| 0x37 | 16.2 | 19.1 | 23.3 | 26.2 |
| 0x38 | 40.3 | 44.2 | 47.1 | 50.3 |
| 0x39 | 53.2 | 56.1 | 60.3 | 63.2 |
| 0x3a | 3.1 | 6.3 | 10.2 | 13.1 |
| 0x3b | 16.3 | 19.2 | 23.1 | 26.3 |
| 0x3c | 40.4 | 44.6 | 47.5 | 50.4 |
| 0x3d | 53.6 | 56.5 | 60.4 | 63.6 |
| 0x3e | 3.5 | 6.4 | 10.6 | 13.5 |
| 0x3f | 16.4 | 19.6 | 23.5 | 26.4 |
| 0x40 | 40.5 | 44.4 | 47.6 | 50.5 |
| 0x41 | 53.4 | 56.6 | 60.5 | 63.4 |
| 0x42 | 3.6 | 6.5 | 10.4 | 13.6 |
| 0x43 | 16.5 | 19.4 | 23.6 | 26.5 |
| 0x44 | 40.6 | 44.5 | 47.4 | 50.6 |
| 0x45 | 53.5 | 56.4 | 60.6 | 63.5 |
| 0x46 | 3.4 | 6.6 | 10.5 | 13.4 |
| 0x47 | 16.6 | 19.5 | 23.4 | 26.6 |

WIRELESS RECEIVER DEINTERLEAVER HAVING PARTITIONED MEMORY

BACKGROUND OF THE INVENTION

1. Field of the Invention

The present invention relates to a deinterleaver module of a wireless receiver, for example a IEEE 802.11a based Orthogonal Frequency Division Multiplexing (OFDM) receiver.

2. Background Art

Local area networks historically have used a network cable or other media to link stations on a network. Newer wireless technologies are being developed to utilize OFDM modulation techniques for wireless local area networking applications, including wireless LANs (i.e., wireless infrastructures having fixed access points), mobile ad hoc networks, etc.. In particular, the IEEE Standard 802.11a, entitled "Wireless LAN Medium Access Control (MAC) and Physical Layer (PHY) specifications: High-speed Physical Layer in the 5 GHz Band", specifies an OFDM PHY for a wireless LAN with data payload communication capabilities of up to 54 Mbps. The IEEE 802.11a Standard specifies a PHY system that uses fifty-two (52) subcarrier frequencies that are modulated using binary or quadrature phase shift keying (BPSK/QPSK), 16-quadrature amplitude modulation (QAM), or 64-QAM.

Hence, the IEEE Standard 802.11a specifies an OFDM PHY that provides high speed wireless data transmission with multiple techniques for minimizing data errors.

A particular concern in implementing an IEEE 802.11 based OFDM PHY in hardware involves providing a cost-effective, compact device that can be implemented in smaller wireless devices. Hence, implementation concerns typically involve cost, device size, and device complexity.

For example, the IEEE Standard 802.11a specifies that interleaving is performed on the transmit data stream using a two-step permutation to improve bit error rate performance in the presence of frequency-selective channel fading. In particular, adjacent coded bits are mapped in the first permutation onto non-adjacent subcarrier frequencies (i.e., "tones") to prevent frequency-selective fading; depending on the modulation scheme used by the transmitter (e.g., BPSQ, QPSK, 16-QAM, or 64-QAM), adjacent coded bits also may be mapped in the second permutation onto alternately less and more significant bits in the constellation map (I+jQ) to reduce long runs of low reliability (i.e., least significant bit) values.

Hence, an OFDM PHY receiver configured for receiving IEEE 802.11a based wireless signals requires a deinterleaver to perform the two inverse permutations applied to the code words prior to transmission. However, the block size for each interleaving permutation is variable, based on the modulation scheme utilized by the transmitter (e.g., BPSK, QPSK, 16-QAM, or 64-QAM). Moreover, the mere storage of the serial data stream into successive memory locations of a random memory, followed by two-stage manipulation of the serial data stream following storage thereof to recover the deinterleaved data, may create substantial latency delays within the deinterleaver due to the processing overhead and the substantial memory read/write access operations necessary to deinterleave the received serial stream.

SUMMARY OF THE INVENTION

There is a need for an arrangement that enables a wireless transceiver host to perform deinterleaving of a received serial stream in an efficient and economical manner.

There also is a need for an arrangement that enables a wireless transceiver host to perform deinterleaving of a received serial stream with minimal latency.

These and other needs are attained by the present invention, where a deinterleaver module in an OFDM wireless transceiver includes partitioned memory banks for storage of code word fragments from an interleaved data stream, each code word fragment associated with a prescribed subcarrier frequency. Each code word fragment includes a prescribed number of code word bits based on a prescribed modulation of the interleaved data stream, and the code word bits for each code word fragment are written into respective selected locations of the corresponding memory bank based on the prescribed modulation and the corresponding prescribed subcarrier frequency. The deinterleaver module outputs deinterleaved data from the memory banks based on parallel output of the respective stored code word bits from a selected address of the memory banks.

Hence, deinterleaving operations can be efficiently implemented based on implementing serial-input/parallel output write/read operations within partitioned memory banks.

One aspect of the present invention provides a method in a deinterleaver module for deinterleaving interleaved data into deinterleaved data. The method includes storing a first group of successive code word fragments from the interleaved data into a respective group of partitioned memory banks. Each code word fragment is associated with a prescribed subcarrier frequency and has a prescribed number of code word bits based on a prescribed modulation of the interleaved data. The storing includes writing the code word bits for each code word fragment into respective selected locations of the corresponding memory bank based on the prescribed modulation and the corresponding prescribed subcarrier frequency. The method also includes outputting a selected portion of the deinterleaved data by retrieving, in parallel, code word bits stored at a corresponding selected address for the memory banks.

Another aspect of the present invention provides a deinterleaver module including a group of partitioned memory banks, a write logic module, and an output module. The group of partitioned memory banks is configured for storing interleaved data as a respective group of successive code word fragments. Each code word fragment is associated with a prescribed subcarrier frequency and has a prescribed number of code word bits based on a prescribed modulation of the interleaved data. Each memory bank is configured for storing a selected bit of a corresponding received code word fragment at a corresponding selected location. The write logic module is configured for storing, for each memory bank, the code word bits for each corresponding code word fragment into the respective selected locations based on the prescribed modulation and the corresponding prescribed subcarrier frequency. The output module is configured for outputting deinterleaved data from the partitioned memory banks by retrieving, in parallel, code word bits stored at a corresponding selected address for the memory banks.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

The disclosed embodiment will be described with reference to an overview of an IEEE 802.11 OFDM transceiver, followed by a detailed description of the deinterleaver implemented according to an embodiment of the present invention.

Receiver Architecture Overview

Figure 1:
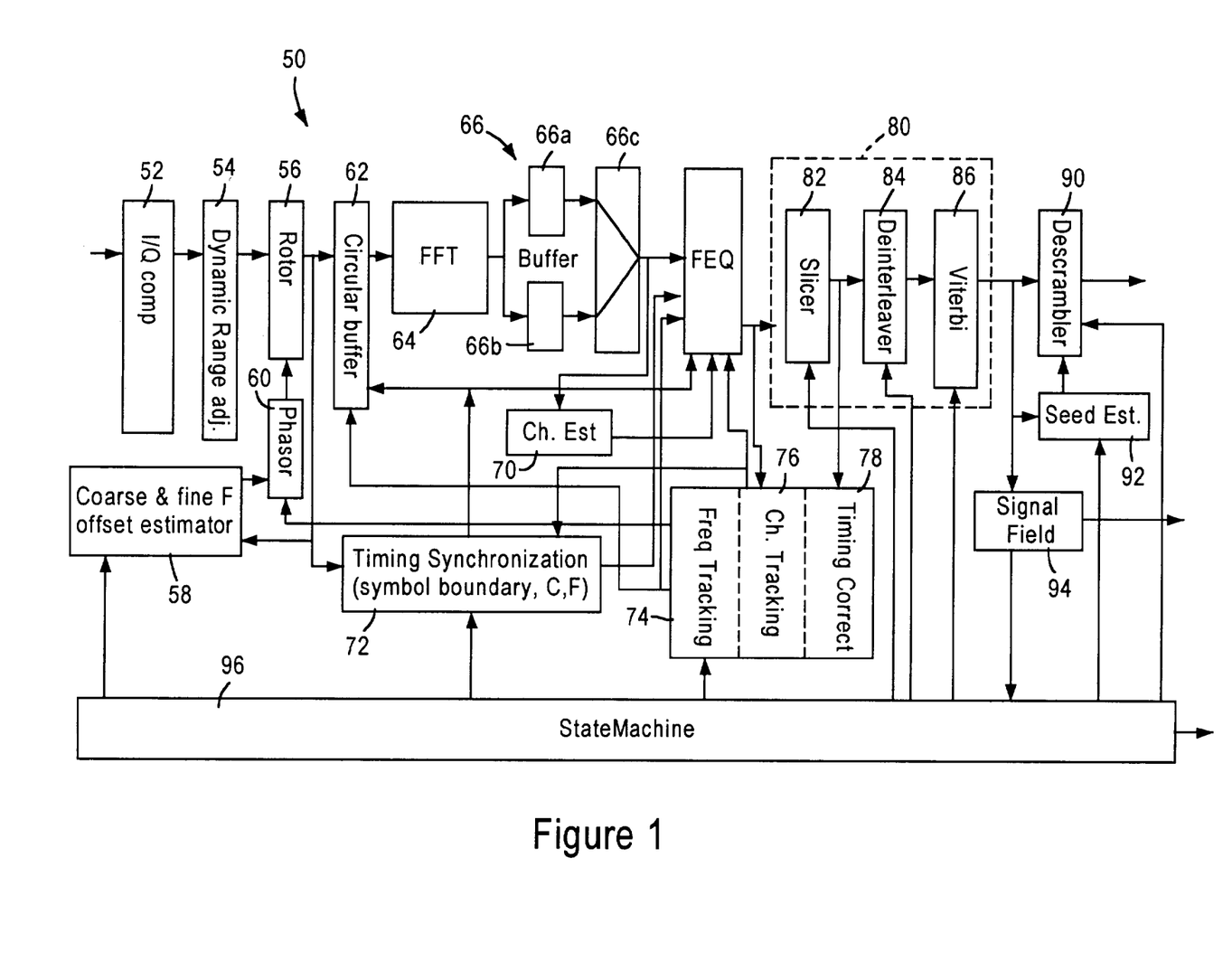
FIG. 1 is a diagram illustrating a receiver module of an IEEE 802.11 OFDM transceiver having a deinterleaver implemented according to an embodiment of the present invention.

FIG. 1 is a diagram illustrating an architecture of a receiver module 50 of an IEEE 802.11 Orthogonal Frequency Division Multiplexing (OFDM) transceiver, according to an embodiment of the present invention. The receiver module 50, implemented as a digital circuit, includes an I/Q mismatch compensation module 52 that receives detected wireless signal samples (in digital form) from an R/F front end, for example a receiver amplifier. The detected wireless signal samples include an I component and Q component: these I and Q components, which ideally should be orthogonal to each other and have a uniform relative gain, may in fact have a non-orthogonal phase difference (i.e., other than 90 degrees) and have an unequal gain. Hence, the I/Q mismatch compensation module is configured for compensating the mismatched I/Q components to generate compensated signal samples having matched I/Q components with orthogonal phase difference and a uniform relative gain.

The receiver module 50 also includes a dynamic range adjustment module 54. The dynamic range adjustment module 54 is configured for adjusting the gain of the compensated signal samples to a prescribed dynamic range for optimized signal processing, thereby outputting adjusted signal samples according to the prescribed dynamic range.

The rotor circuit 56 is configured for compensating between a local receiver carrier frequency (i.e., local oscillator) and the remote transmitter carrier frequency (i.e., remote oscillator) used to transmit the wireless signal. In particular, the course/fine frequency offset estimator 58 is configured for estimating the difference in the frequency between the local receiver carrier frequency and the remote receiver carrier frequency, and supplying this difference to a phasor circuit 60; the phasor circuit 60 converts the difference value to a complex phasor value (including angle information) which is supplied to the rotor circuit 56. Hence, the rotor circuit 56 rotates the adjusted signal samples based on the complex phasor value, and outputs rotated signal samples.

The circular buffer 62 is configured for buffering the rotated signal samples. In particular, the beginning of a data packet is not guaranteed to be located at the same position within the sequence of rotated signal samples. Hence, the rotated signal samples are stored in the circular buffer 62 in a manner such that any data sample within a prescribed duration (e.g., one maximum-length data packet) can be located and retrieved from the circular buffer 62. Once the circular buffer 62 reaches capacity, any new signal sample to be stored in the circular buffer 62 is overwritten over the oldest stored signal sample. Hence, the circular buffer 62 enables the receiver 50 to adjust the "starting point" of the data packet within the sequence of rotated signal samples.

The Fast Fourier Transform (FFT) circuit 64 is configured for converting the time-based sequence of rotated signal samples into a frequency domain-based series of prescribed frequency points (i.e., "tones"); according to the disclosed embodiment, the FFT circuit 64 maps the rotated signal samples to a frequency domain of fifty-two (52) available tones.

In particular, the available fifty-two (52) tones are used to transport information: four (4) tones are used as pilot tones, and the remaining forty-eight (48) tones are data tones, where each tone may carry from one to six (1-6) bits of information. According to the IEEE 802.11a/g specification, the physical layer data packet should include a short training sequence, a long training sequence, a signal field (indicating the data rate and length of the payload, and coded at the lowest data rate of 6 Mbps), and the payload data symbols encoded in one of eight data rates from 6 Mbps to 54 Mbps. The FFT circuit 64 determines the data rate from the signal field, and recovers the data tones.

The FFT circuit 64 outputs a group of tone data to a buffer 66, illustrated as a first buffer portion 66a, a second buffer portion 66b, and a switch 66c: the FFT circuit 64 alternately outputs the groups of tone data between the buffer portions 66a and 66b, enabling the switch 66 to output one group of tone data from one buffer portion (e.g., 66a) while the FFT circuit 64 is outputting the next group of tone data into the other buffer portion (e.g., 66b). Note actual implementation may utilize addressing logic to execute the functions of the switch 66c.

Since certain tones output by the FFT 64 may have encountered fading due to signal attenuation and distortion on the wireless channel, equalization is necessary to correct the fading. The frequency domain equalizer 68 is configured for reversing the fading encountered by the tones in order to provide equalized tones. Channel information is obtained by the channel estimator 70 from the long training sequence in the IEEE 802.11 preamble; the channel information is used by the channel estimator 70 to estimate the channel characteristics; the estimated channel characteristics are supplied to the frequency equalizer 68 to enable equalization of each tone.

In addition to the coarse and fine frequency offset estimator 58, the phasor circuit 60 and the channel estimator 70, the receiver module 50 also includes a timing synchronization module 72, a frequency tracking block 74, a channel tracking block 76, and a timing correction block 78 for controlling signal conditioning to ensure the received signal samples are decoded properly to accurately recover the data symbols.

The decoding portion 80 includes a digital slicer module 82, a deinterleaver 84, and a Viterbi decoder 86. The digital slicer module recovers up to 6 bits of symbol data from each tone, based on the data rate specified in the signal field in the preamble. The deinterleaver 84 performs the converse operation of the transmitter interleaver circuit, and rearranges the data back into the proper sequence of deinterleaved data. The Viterbi decoder 86 is configured for decoding the deinterleaved data into decoded data, in accordance with the IEEE 802.11 specification.

The descrambler circuit 90 is configured for recovering the original serial bit stream from the decoded data, by descrambling a 127-bit sequence generated by the scrambler of the transmitter, according to the IEEE 802.11 specification. The descrambler circuit 90 utilizes a scrambling seed, recovered from the service field of the data packet by the seed estimation circuit 92, for the descrambling operation. The signal field information from the preamble also is stored in a signal field buffer 94, configured for storing the length and data rate of the payload in the data packet. Overall control of the components of the receiver 50 is maintained by the state machine 96.

Hence, the serial bit stream recovered by the descrambler circuit 90 is output to an IEEE 802.11 compliant Media Access Controller (MAC).

Deinterleaver Having Partitioned Memory Banks

Figure 2:
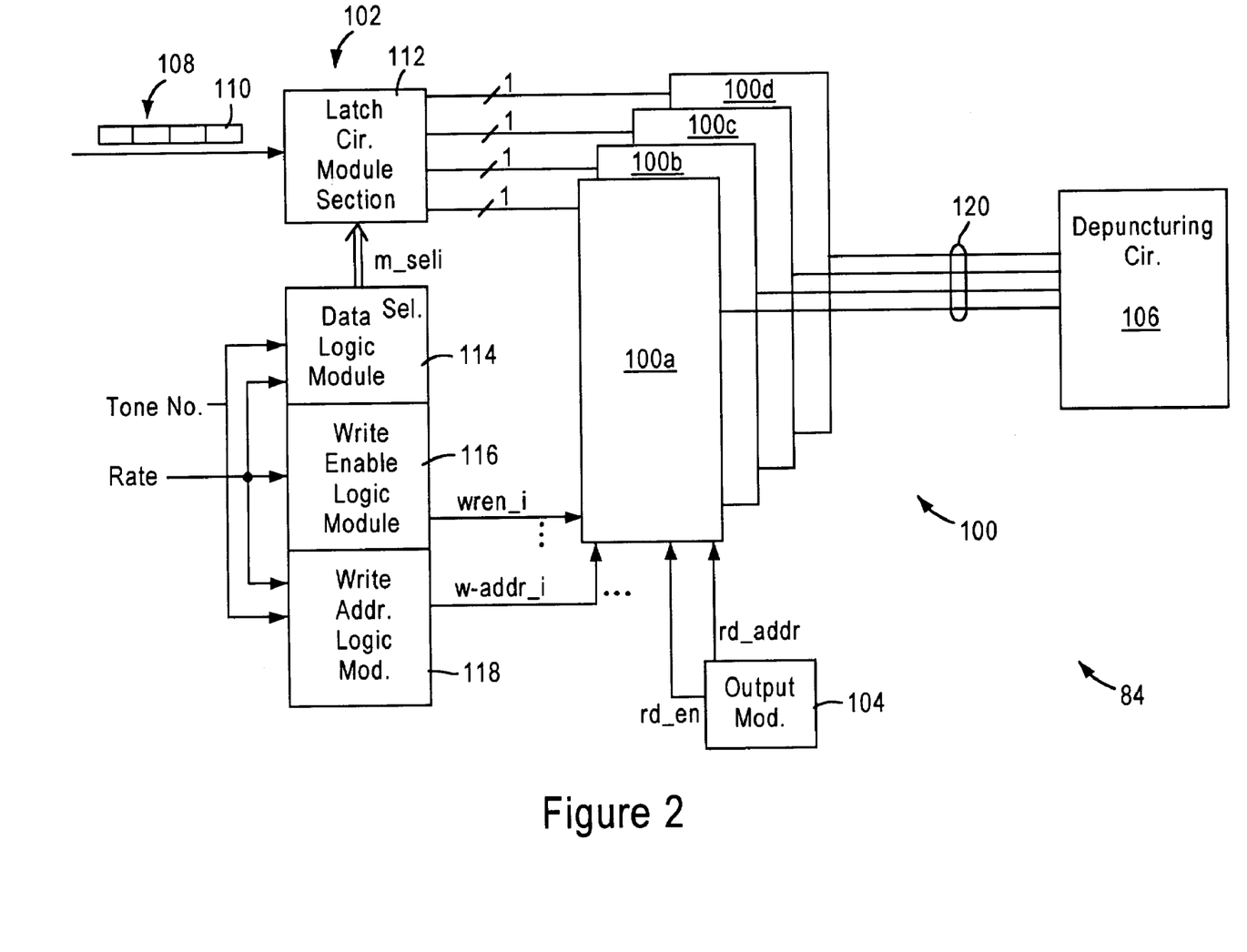
FIG. 2 is a diagram illustrating the deinterleaver of FIG. 1, according to an embodiment of the present invention.

FIG. 2 is a diagram illustrating in detail the deinterleaver module 84 of FIG. 1, according to an embodiment of the present invention. The deinterleaver module 84 includes a group of partitioned memory banks 100 (e.g., 100a, 100b, 100c, and 100d), a write logic module 102, an output module 104, and a depuncturing circuit 106.

The deinterleaver module 84 receives an input data stream 108 of interleaved data for a code word. In particular, packet data, in the form of bits, is interleaved prior to transmission for two reasons: map adjacent coded bits onto non-adjacent subcarrier frequencies (i.e., tones) to combat frequency-selective fading; and map adjacent coded bits onto alternately less and more significant bits in the constellation to combat white noise. Hence, the input data stream to the deinterleaver module 84 is composed of fragments 110 of a code word (e.g., 48-bit code word, 96-bit code word, 192-bit code word, or 288-bit code word), where each fragment is transmitted on a particular tone. Hence, collection of the fragments over the forty-eight (48) data tones enables recovery of the original code word.

The disclosed deinterleaver 84 is configured for storing the code word fragments from the interleaved data stream 108 into the partitioned memory banks 100 in a serial sequence, described below, where a group of successive code word fragments 110 are stored into the respective group of partitioned memory banks. Hence, the first group of the first, second, third, and fourth code word fragments 110 are stored in the memory banks 100a, 100b, 100c, and 100d, respectively, and the next group of the fifth, sixth, seventh, and eighth code word fragments 110 are stored in the memory banks 100a, 100b, 100c, and 100d, respectively.

The write logic module 102 includes a latch circuit module section 112, a data select logic module 114, a write enable logic module 116, and a write address logic module 118. As described below, these modules enable the code word bits for a given code word fragment 110 to be stored into the corresponding memory bank (e.g., 100a) based on the prescribed modulation and the corresponding prescribed subcarrier frequency, enabling deinterleaving operations to be performed based on writing the code word bits into the partitioned memory banks 100. Hence, the output module 104 outputs deinterleaved data 120 by retrieving, in parallel, code word bits from a given address (rd_addr) of the memory banks 100.

As described in detail below, the write logic module 102 is configured for storing, for each memory bank (e.g., 100a), code word bits for a corresponding code word fragment into respective selected locations based on the modulation in use (e.g., BPSK, QPSK, 16-QAM, or 64-QAM), and the subcarrier frequency (i.e., tone number) used for modulating the corresponding code word fragment. Bit selection is performed by the data selection module 114, and address selection is performed by the write address logic module 118.

Figures 3, 5:
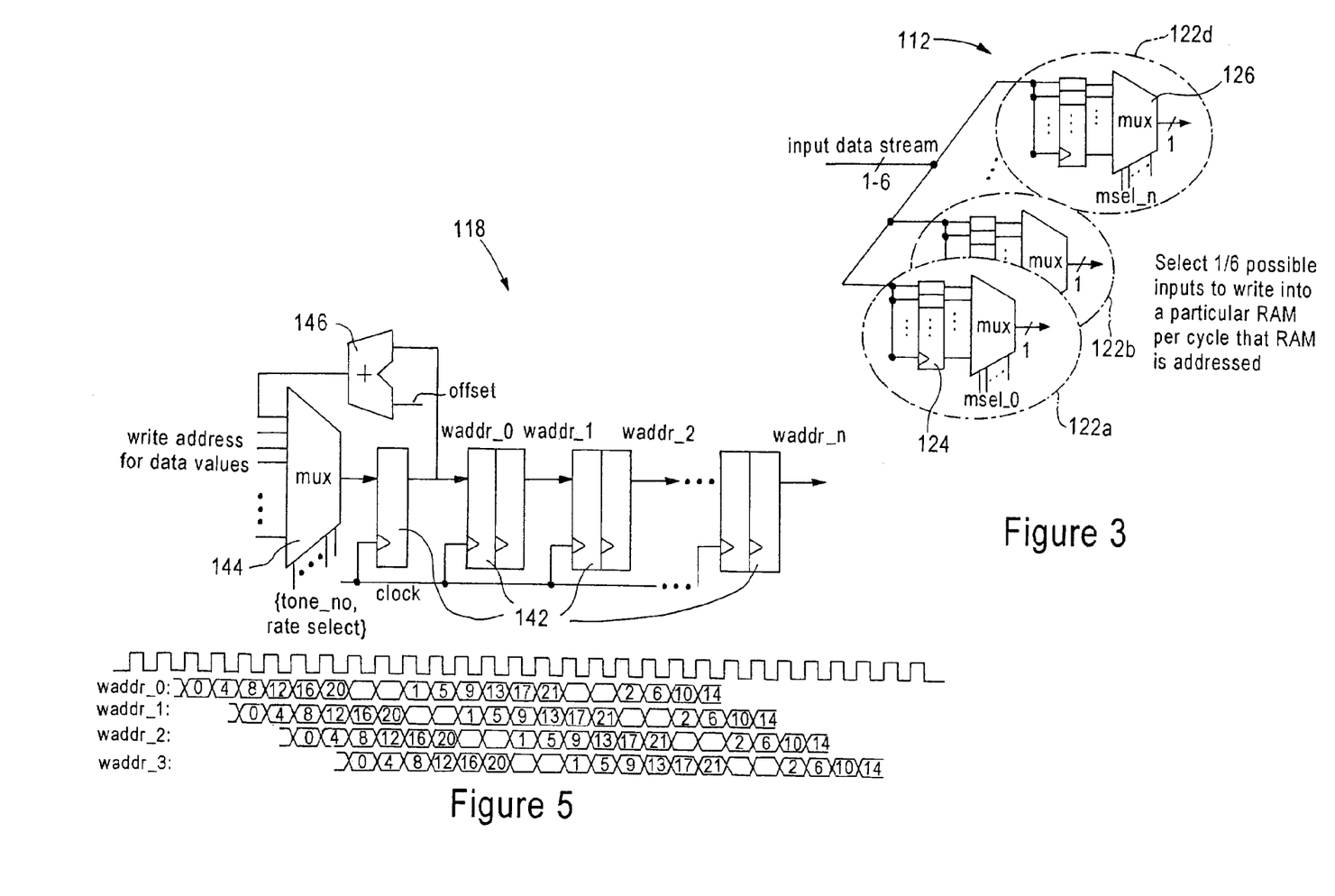
FIG. 3 is a diagram illustrating in detail the latch circuit module of FIG. 2.
FIG. 5 is a diagram summarizing operation of the write address logic module of FIG. 2.

FIG. 3 is a block diagram illustrating in detail the latch circuit module section 112 of FIG. 2. The latch circuit module section 112 includes latch circuit modules 122a, 122b, 122c (not shown) and 122d for each of the respective memory banks 100a, 100b, 100c, and 100d. Each latch circuit module 122 includes a six-element register 124 configured for latching each corresponding code word fragment in response to a latch signal, described below, and a multiplexer 126. The multiplexer 126 is configured for outputting a selected bit of the latched code word fragment to the corresponding memory bank (e.g., 100a) in response to a bit selection signal (e.g., msel_0).

Figure 4:
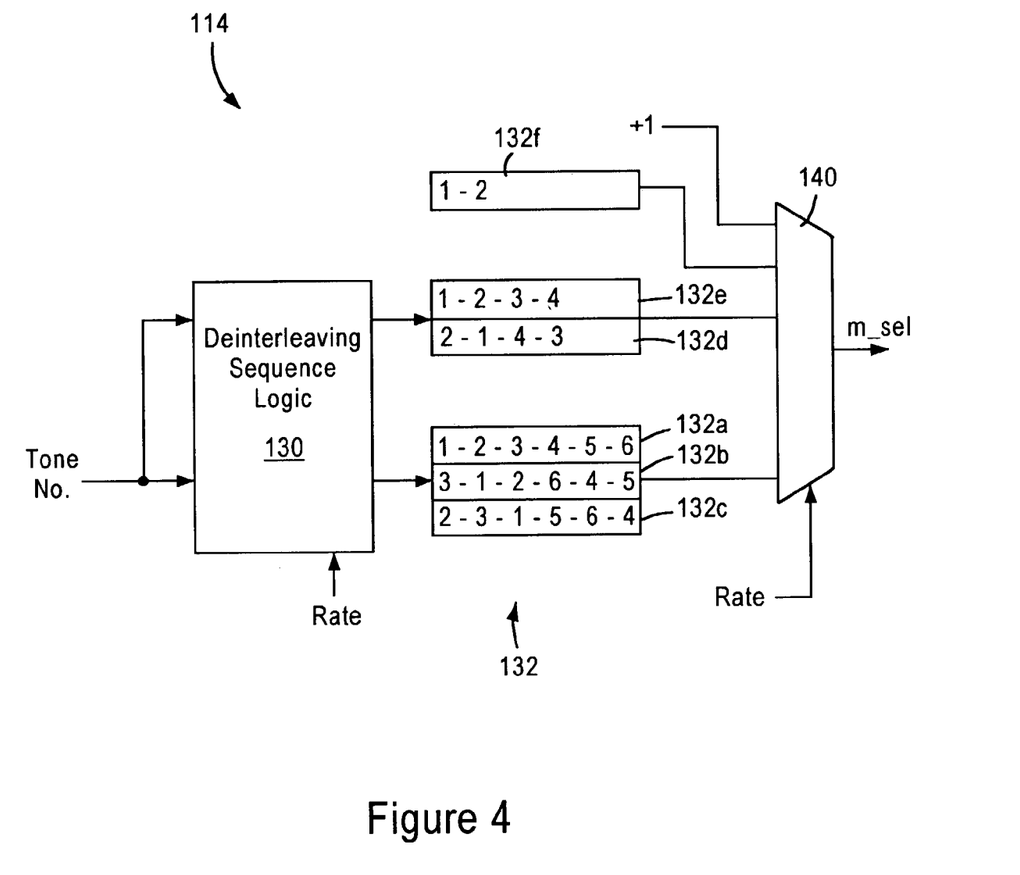
FIG. 4 is a diagram illustrating in detail the data selection logic module of FIG. 2.

The bit selection signals (e.g., msel_0) supplied to the multiplexers 126 are generated by the data selection logic module 114. FIG. 4 is a simplified illustration of the data selection logic module 114. The data selection logic module 114 includes the deinterleaving sequence logic 130, configured for selecting a bit deinterleaving sequence (e.g., 132a) based (in part) on the corresponding subcarrier frequency used for the corresponding code word fragment. In particular, interleaving sequences in the transmitter are selected based on the subcarrier frequency (i.e., tone number) used for modulation, and the modulation type which determines the number of bits that are modulated in a given tone number. Hence, in the case of 64-QAM, the deinterleaving sequence logic 130 maps the identified tone to one of three available deinterleaving sequences 132a, 132b, or 132c.

The multiplexer 140 is configured for outputting the deinterleaving sequence for the appropriate modulation (e.g., no sequence for BPSK, 1-2 sequence for QPSK, 1-2-3-4 or 2-1-4-3 for 16-QAM, and 1-2-3-4-5-6, 3-1-2-6-4-5, or 2-3-1-5-6-4 for 64-QAM). Other sequences also may be used. Although not illustrated in FIG. 4, the bit deinterleaving sequences are supplied successively for each clock cycle, enabling the corresponding multiplexer 126 to output the appropriate selected bit each clock cycle for storage in the corresponding memory bank (e.g., 100a). In addition, the data selection module 114 performs the selection of bit deinterleaving sequences for each of the multiplexers 126 of the latch circuit modules 122a, 122b, 122c, and 122d.

FIG. 5 is a diagram illustrating the write address logic module 118 of FIG. 2. The write address logic module 118 is configured for selecting, for each code word fragment, the respective addresses for storage of the code word bits based on the modulation, the subcarrier frequency, and a prescribed offset relative to each successive group of successive code word fragments. In particular, the write address logic module 118 includes latches 142 that enable a generated address value to be cascaded (i.e., linear shifted) across the respective memory banks 100. Hence, a given address (e.g., waddr_i=0) will first be supplied to the memory bank 100a (waddr_0=0) for the first code word bit to be stored; after two clock cycles the address will be supplied to the next memory bank 100b (waddr_1=0) for the corresponding first code word bit to be stored, etc., enabling the memory banks to share addressing logic. The next address (waddr_0=4) for the next code word bit to be stored is then propagated the next clock cycle.

The write address logic module 118 also includes multiplexer based logic 144, and an adder 146. The adder 146 is used to add a prescribed offset to each code word bit that needs to be stored in the memory bank; as illustrated in FIG. 5, the offset value is set to a value of "offset=4". As illustrated in FIG. 5, the six (6) code word bits for each code word fragment in the first group supplied to the memory banks 100a, 100b, 100c, and 100d are stored at address 0, 4, 8, 12, 16, and 20 (assuming 64-QAM).

Once the first group of code word fragments has been stored, the multiplexer logic 144 selects the next group of available addresses (e.g., "1") for storage of the next group of code word fragments.

Figure 6:
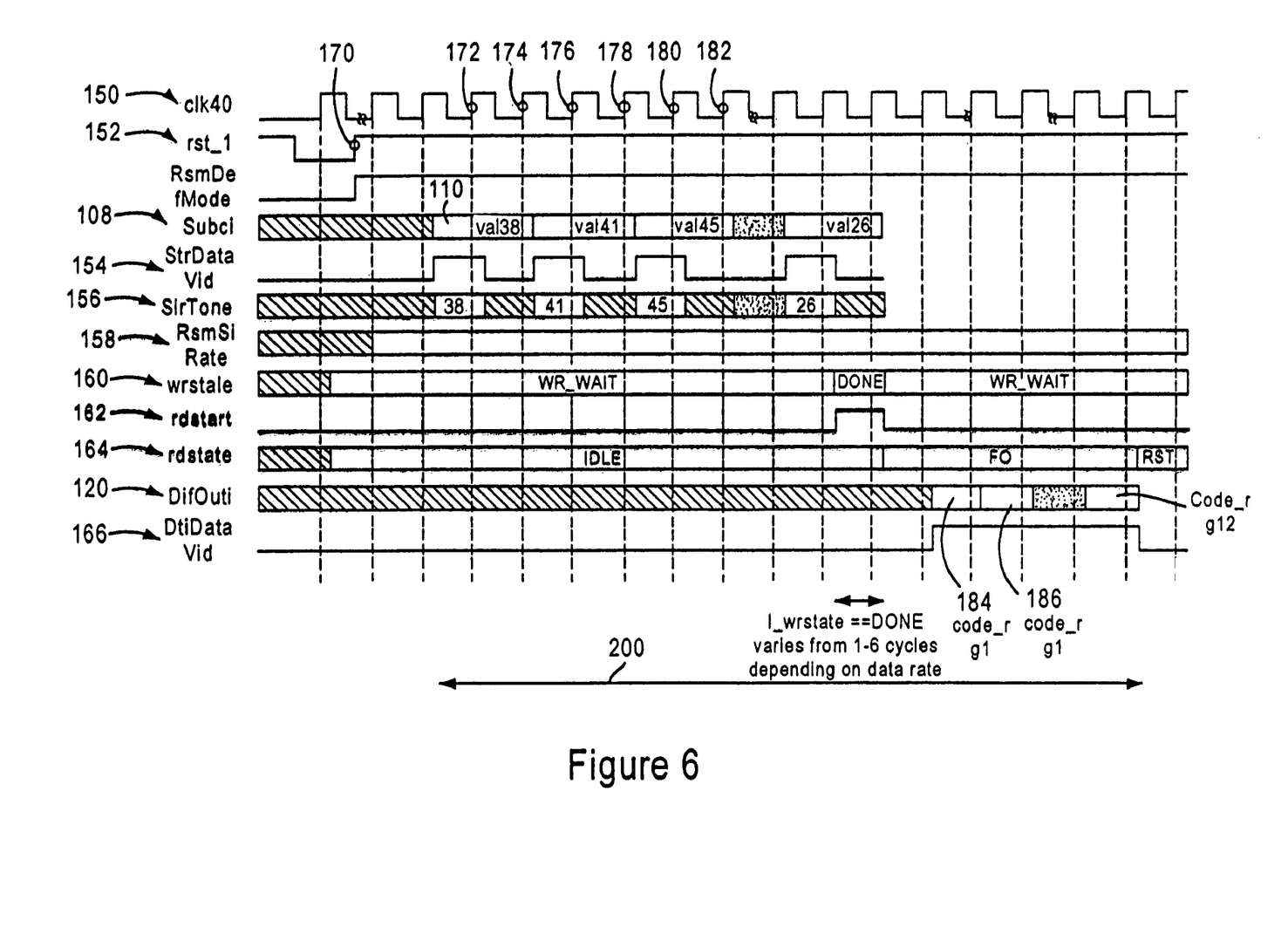
FIG. 6 is a timing diagram illustrating the writing of interleaved data, and reading of deinterleaved data, by the deinterleaver module of FIG. 2, according to an embodiment of the present invention.

FIG. 6 is a timing diagram illustrating the writing of interleaved data 108 into the memory banks 100, and the reading of the interleaved data 120, according to an embodiment of the present invention. FIG. 6 illustrates a clock signal 150, a reset signal 152, the incoming stream 108 of code word fragments 110, a data valid strobe 154, a tone identifier 156 that specifies the corresponding subcarrier frequency for the corresponding code word fragment 110, a modulation rate identifier 158, the write state status signal 160, a read start signal 162, a read state status signal 164, output data 120, and an output data valid strobe 166.

FIGS. 7A, 7B, 7C, and 7D illustrate storage of code word fragments according to BPSK (1-bit) modulation, QPSK (2-bit) modulation, 16-QAM (4-bit) modulation, and 64-QAM (6-bit) modulation, respectively. Each of the FIGS. 7A, 7B, 7C and 7D store the sequence 108 of code word fragments corresponding to the forty-eight (48) data tones according to the sequence 38, 41, 45, 48, 51, 54, 58, 61, 1, 4, 8, 11, 14, 17, 20, 24, 39, 42, 46, 49, . . . 3, 6, 10, 13, 16, 19, 23, 26.

Figure 7A:
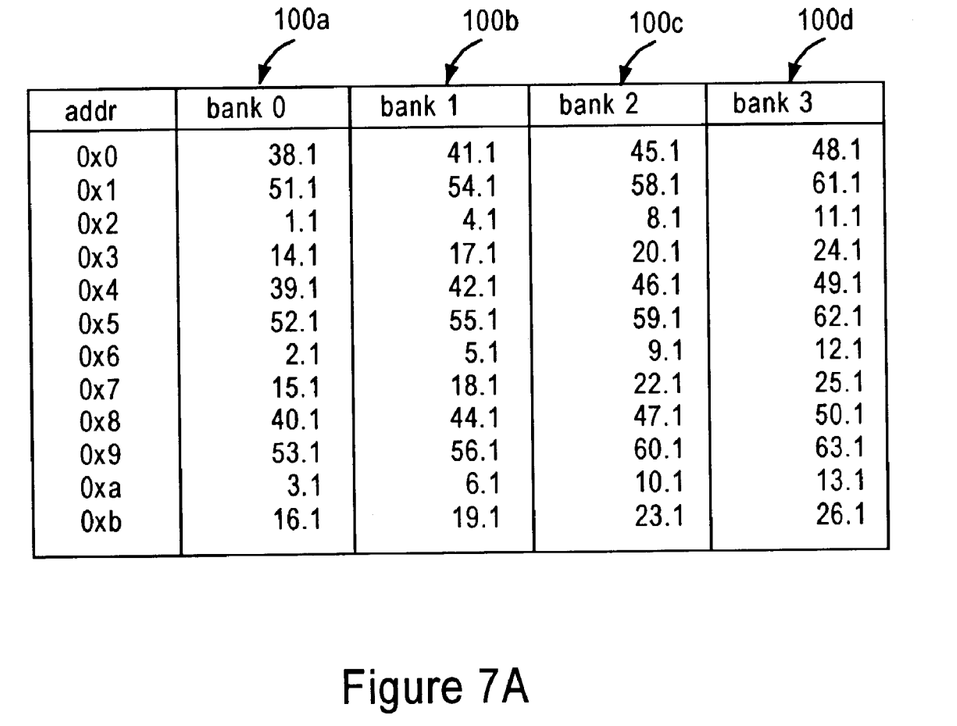
FIGS. 7A, 7B, 7C, and 7D are diagrams illustrating storage of code word bits within the partitioned memory banks of FIG. 2, according to binary phase shift keying modulation, quadrature phase shift keying modulation, 16-QAM modulation, and 64-QAM modulation, respectively, according to an embodiment of the present invention.

Referring to FIG. 6, the latch circuit 122a latches the first code word fragment 110 (val38), following the reset signal at event 170, at the rising clock edge of event 172 based on a latch signal (not shown). The tone number value 156 is supplied to the data selection logic module 114 and the write address logic module 118, enabling identification of the appropriate deinterleaving sequence 132 of FIG. 4. In addition, the modulation rate 158 specifies the modulation type (e.g., 6 Mbps corresponds to BPSK). Assuming for simplicity that BPSK is used, the code word fragments 110 are stored in the memory banks 100 as illustrated in FIG. 7A. Hence, since only a single bit is represented in a BPSK-modulated code word fragment 110, the multiplexer 144 of the write address logic module 118 supplies the write addresses in contiguous sequence. The output module 104 within output in parallel the 4-bit outputs 120 starting at event 184.

Figure 7B:
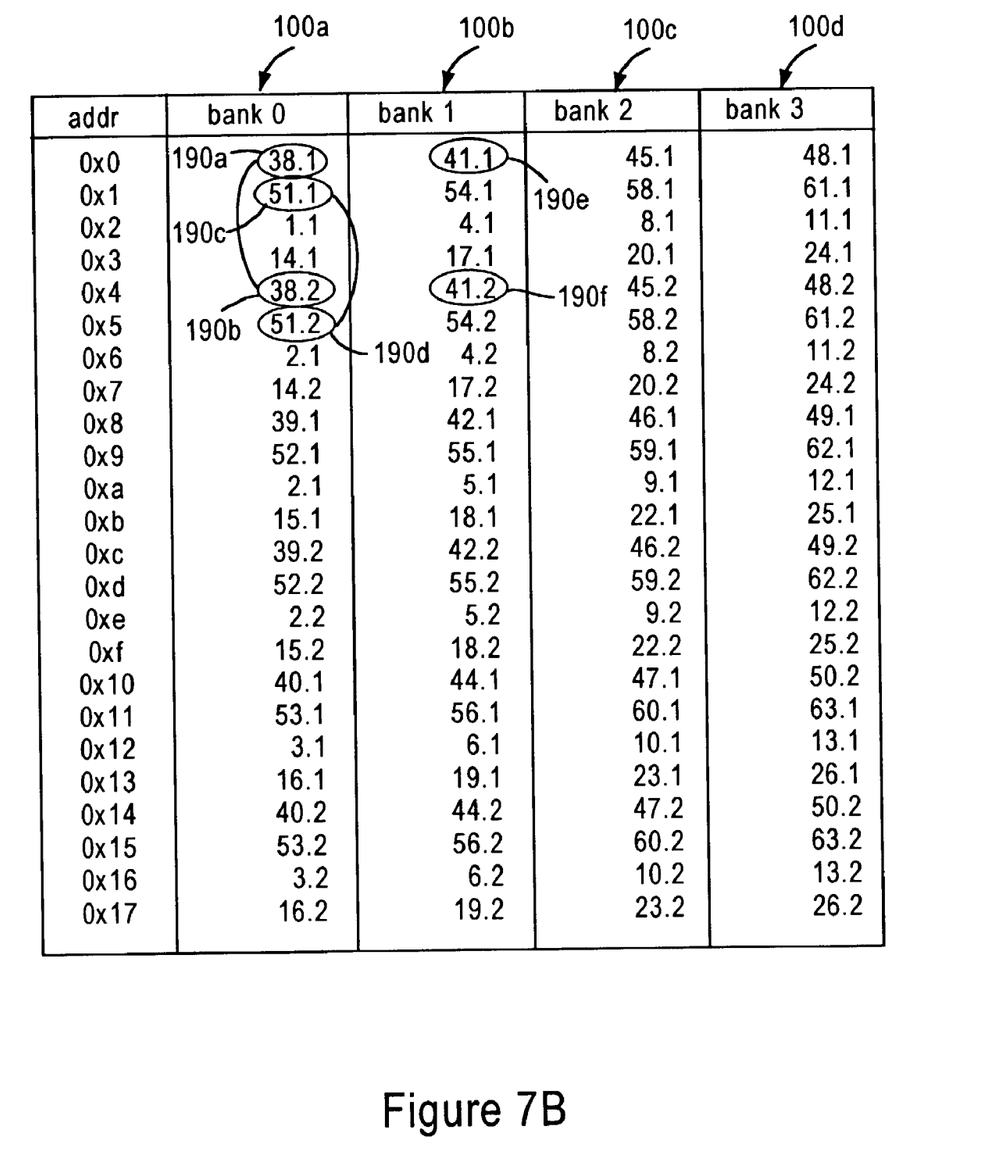

In the case of QPSK, illustrated in FIG. 7B, the data selection logic module 114 generates selection signals for the multiplexers 126 to supply the code word bits 190 according to the sequence 1, 2, 1, 2, etc. The write address logic module 118 supplies the write address for writing each code word bit 190. Hence, at event 172 the latch circuit module 122a would store the code word bit 190a in the memory bank 100a at address "0"; at event 174 the latch circuit module 122a would store the code word bit 190b in the memory bank 100a at address "4".

At event 176 the code word fragment 108 for the next subcarrier frequency "41" would be latched into the latch circuit module 122b, and the code word bit 190e (41.1) would be written into the memory bank 100b at address "0", followed by the storage at event 178 of the next code word bit 190f into the memory bank 100b at address "4".

After the first group of code word fragments for tones 38, 41, 45, and 48 have been stored, the write address logic module 118 increments the address pointer for storage of the code word bits (e.g., 190c and 190d) for the next code word fragment at addresses "1" and "5", respectively. The storage sequence continues until the last code word fragment is stored corresponding to tone 26.

Figure 7C:
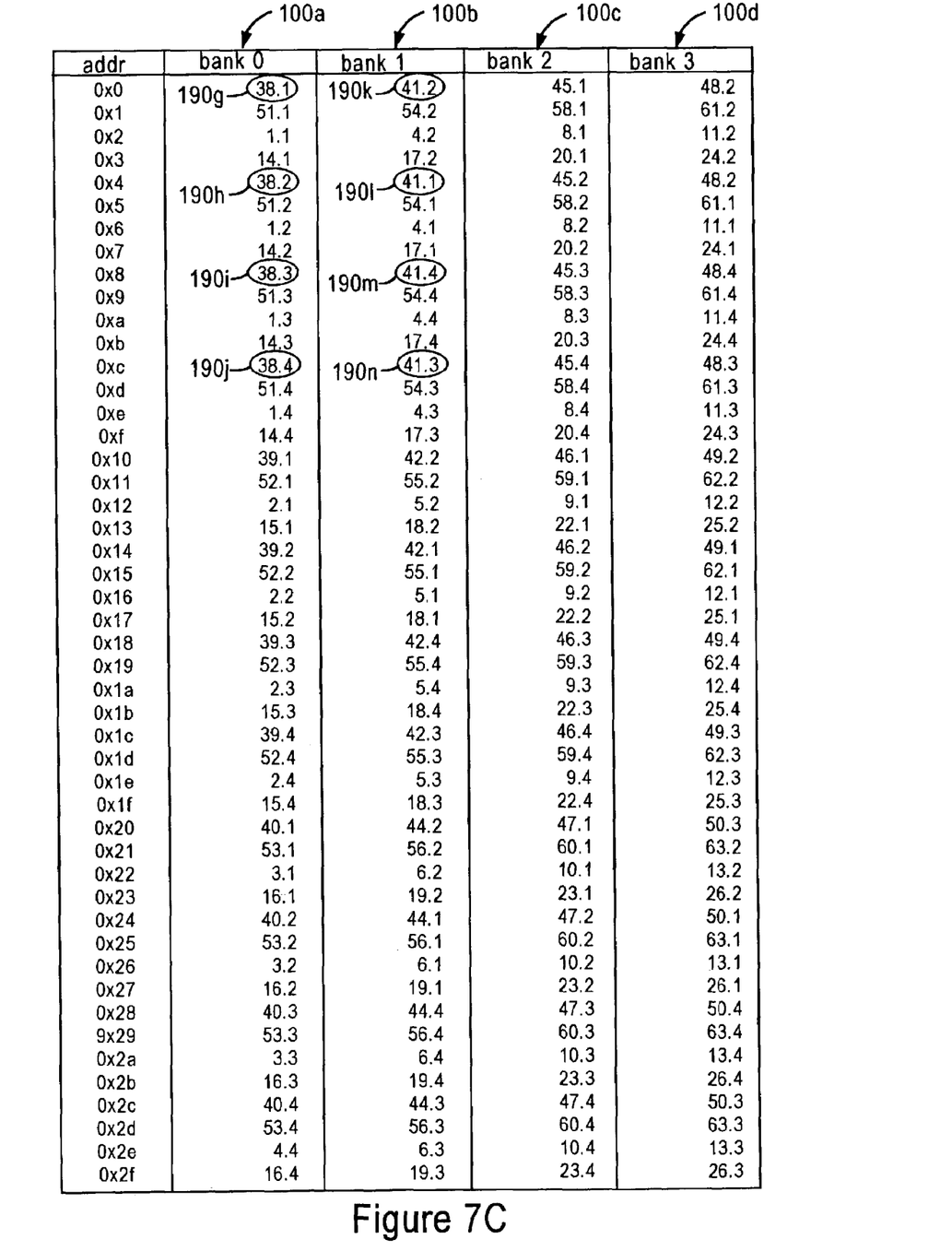

FIG. 7C illustrates storage of the 4-bit 16-QAM modulated code word fragments 110. In particular, the code word bits 190g, 190h, 190i, and 190j for the code word fragment 110 corresponding to tone 38 are stored at events 172, 174, 176, and 178 at addresses "0", "4", "8", and "c" (hexadecimal), respectively. The code word bits 190k, 190l, 190m, and 190n for the code word fragment 110 corresponding to tone 41 are stored at events 176, 178, 180, and 182 at addresses "0", "4", "8", and "c" (hexadecimal), respectively.

Note that the code word bits 190g, 190h, 190i, and 190j for the code word fragment 110 corresponding to tone 38 are written according to the bit deinterleaving sequence 132e ("1-2-3-4"), whereas the code word bits 190k, 190l, 190m, and 190n for the code word fragment 110 corresponding to tone 41 are written according to the bit deinterleaving sequence 132e ("2-1-4-3"). As described above, the bit deinterleaving sequence may be selected for the corresponding modulation rate based on the tone number, where each tone number maps to one of a prescribed group of deinterleaving sequences 132 via the deinterleaving sequence logic 130. Hence, the first four-bit output value 120 at event 184 would include the bits "38.1, 41.2, 45.1, and 48.2", followed by the next four-bit output value at event 186 including the bits "51.1, 54.2, 58.1, 61.2".

Figure 7D:
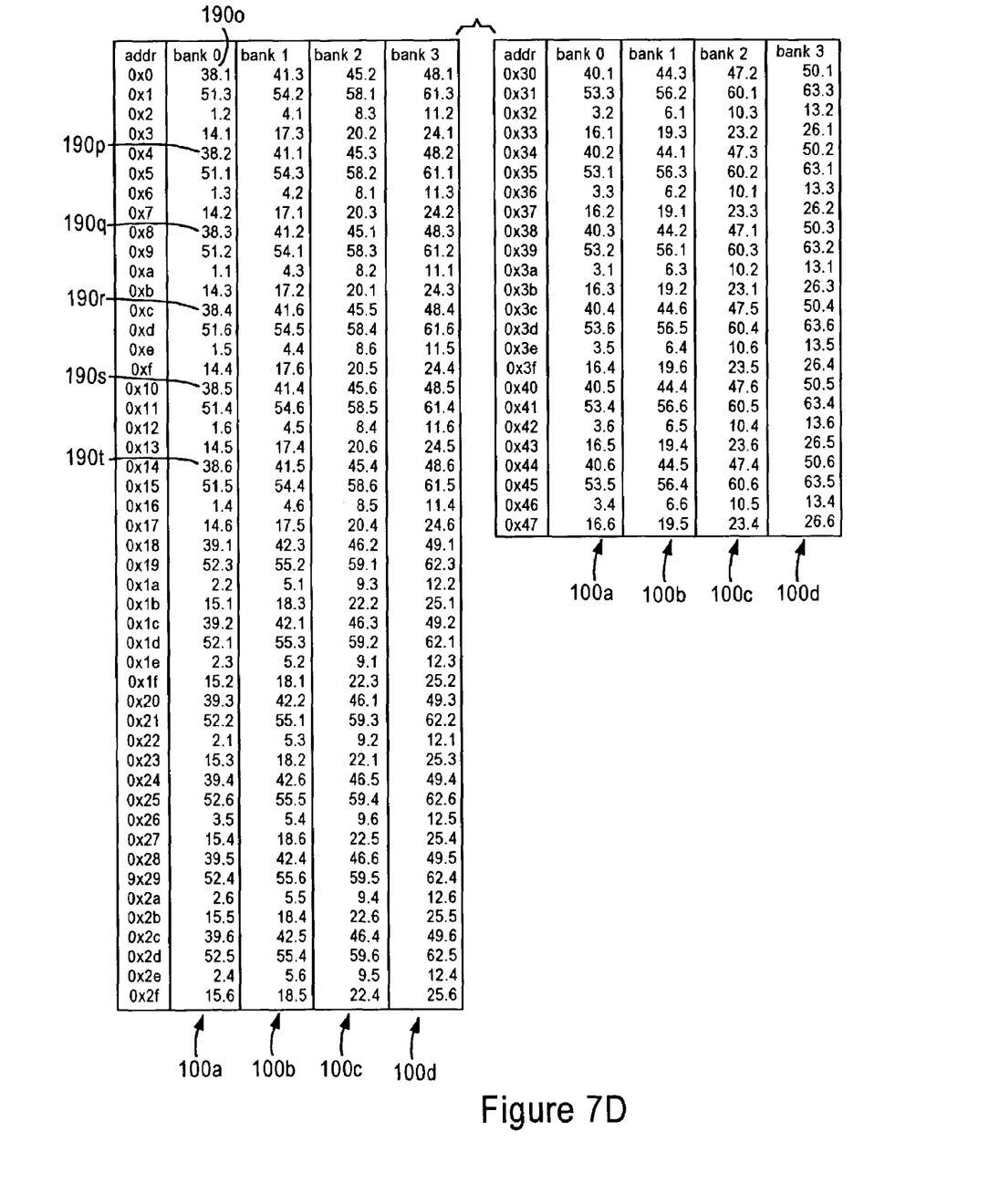

FIG. 7D illustrates storage of the 6-bit 64-QAM modulated code word fragments 110. In particular, the code word bits 190o, 190p, 190q, 190r, 190s, and 190t for the code word fragment 110 corresponding to tone 38 are stored at events 172, 174, 176, 178, 180, and 182 at addresses "0", "4", "8", "c", "10", and "14" (hexadecimal), respectively. The code word bits for the code word fragments 110 corresponding to tones 41, 45, and 48 also are stored at addresses "0", "4", "8", "c", "10", and "14" (hexadecimal).

Note, however, that whereas the code word bits for the code word fragments 110 corresponding to tones 38 and 48 are stored according to the sequence 132a ("1-2-3-4-5-6"), the code word bits for the code word fragments 110 corresponding to tones 41 and 45 are stored according to the sequence 132b ("3-1-2-6-4-5") and 132c ("2-3-1-5-6-4"), respectively. Hence, while the same addressing scheme is used for the group of code word fragments for the first four tones 38, 41, 45, and 48, different deinterleaving sequences 132 are selected for the latch circuit modules 122 based on the tone number for the given modulation scheme. As described above, the bit deinterleaving sequence is selected for the corresponding modulation rate based on the tone number, where each tone number maps to one of a prescribed group of deinterleaving sequences (e.g., 132a, 132b, or 132c) via the deinterleaving sequence logic 130. Hence, the first four-bit output value 120 at event 184 would include the bits "38.1,

41.3, 45.2, and 48.1", followed by the next four-bit output value at event 186 including the bits "51.3, 54.2, 58.1, 61.3".

In addition, address selection for each successive group of code word fragments is controlled by the address selection logic 144 of FIG. 5 (note address values in FIG. 5 are decimal), enabling the write address logic module 118 to select addresses based on the modulation scheme and the tone number.

According to the disclosed embodiment, a multiple memory bank architecture enables data to be deinterleaved based on the writing of the code word fragments into memory, enabling addressing and deinterleaving logic to be implemented in a flexible manner that enables the deinterleaver module 84 to provide flexibility in deinterleaving different modulation rate data streams within the same architecture. Further, the serial input/parallel output scheme minimizes latency in the deinterleaving process, enabling the deinterleaved data to be output as soon as the first row of data has been stored. Moreover, total operation latency is reduced to less than one OFDM symbol length (160 clock cycles at 40 MHz) based on the overlapping of write and read operations, and cascaded bit deinterleaving. Hence, the output module 104 is configured for outputting the deinterleaved data for an entire code word, from the memory banks 100, within one OFDM symbol time 200 of reception of the interleaved data by the deinterleaver module.

Null Symbol Insertion Method During Deinterleaving

Certain data rates in the IEEE 802.11a specification used punctured code words (bit-stealing function). Code rates not multiples of ½, i.e., punctured code words, make Viterbi decoding more difficult because of odd length input sequences.

Figure 8A:
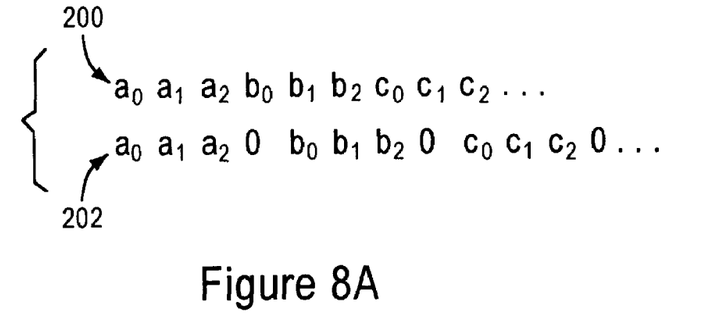
FIGS. 8A, 8B and 8C are diagrams illustrating a null symbol insertion method that may be used during deinterleaving by the receiver of FIG. 1.
Figure 8B:
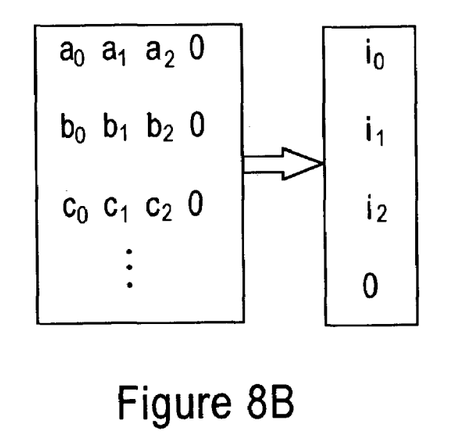
Figure 8C:
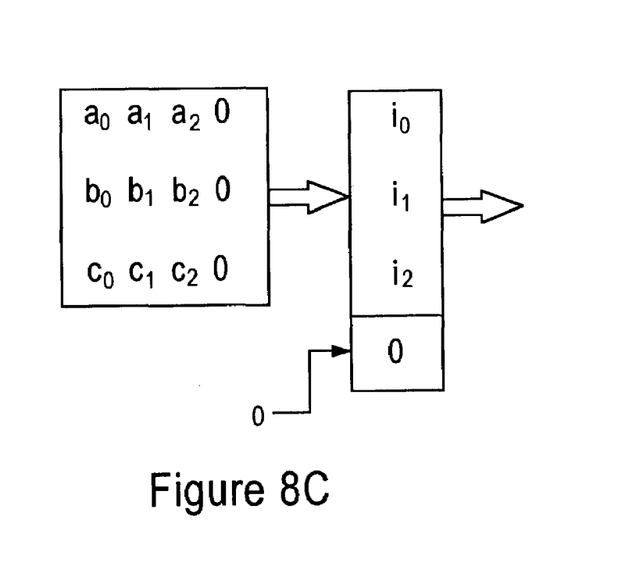

The following null symbol insertion method maintains a constant input data length to the Viterbi decoder while minimizing hardware requirements. FIG. 8A illustrates a representative code word 200 before null symbol insertion and a code word 202 after null symbol insertion. Deinterleaving requires storing an entire code word in memory; however, since the pattern of null symbols is repetitive and known a priori, instead of storing the null symbols in the deinterleaver memory as shown in FIG. 8B, we can save memory storage by inserting the null symbols ("0") after reading out the data from the deinterleaver memory as illustrated in FIG. 8C.

For the largest OFDM code word containing 288 values before insertion and 432 values after insertion, this arrangement saves 144 storage elements, approximately a 1 kbit savings given a 7 bits wide/element application.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method in a deinterleaver module for deinterleaving interleaved data into deinterleaved data, the method including:

storing a first group of successive code word fragments from the interleaved data into a respective group of single bit-wide partitioned memory banks receiving respective write address inputs, wherein:

(1) each code word fragment is associated with a prescribed subcarrier frequency and has a prescribed number of code word bits based on a prescribed modulation of the interleaved data, and (2) the storing includes writing the code word bits for each code word fragment into respective selected locations of the corresponding single bit-wide partitioned memory bank based on supplying a prescribed sequence of address values to the corresponding single bit-wide partitioned memory bank via the corresponding write address input, the prescribed sequence of address values selected based on the prescribed modulation and the corresponding prescribed subcarrier frequency, wherein the prescribed sequence of address values are cascaded across the respective single bit-wide partitioned memory banks; and outputting a selected portion of the deinterleaved data by retrieving, in parallel, code word bits stored at a corresponding selected address for the single bit-wide partitioned memory banks.

2. The method of claim 1, wherein the storing further includes:

latching each code word fragment at a corresponding first clock edge; and successively writing the code word bits for the corresponding code word fragment at respective successive clock edges following the corresponding first clock edge.

3. The method of claim 2, wherein the successively writing includes writing the code word bits into the respective selected locations according to a selected bit deinterleaving sequence.

4. The method of claim 3, wherein the storing further includes selecting, for each of the single bit-wide partitioned memory banks, a corresponding one of a plurality of bit deinterleaving sequences for the corresponding code word fragment based on the prescribed modulation and the corresponding prescribed subcarrier frequency.

5. The method of claim 3, further including storing a second group of the successive code word fragments from the interleaved data into the respective single bit-wide partitioned memory banks by:

(1) selecting, for each single bit-wide partitioned memory bank, a second bit deinterleaving sequence based on the corresponding prescribed subcarrier frequency for the corresponding code word fragment; and (2) successively writing, for each single bit-wide partitioned memory bank, the code word bits for the corresponding code word fragment at respective selected locations according to the second bit deinterleaving sequence and a prescribed offset relative to the first group.

6. The method of claim 3, wherein the storing further includes concurrently writing at least two of the code word bits for respective code word fragments into respective at least two of the single bit-wide partitioned memory banks based on the prescribed sequence of address values cascaded across the single bit-wide partitioned memory banks.

7. The method of claim 1, further including repeating the outputting step for successive addresses for outputting of an entire code word, from the single bit-wide partitioned memory banks, within one OFDM symbol time of reception of the interleaved data by the deinterleaver module.

8. The method of claim 1, wherein the storing further includes concurrently writing at least two of the code word bits for respective code word fragments into respective at least two of the single bit-wide partitioned memory banks based on the prescribed sequence of address values cascaded across the single bit-wide partitioned memory banks.

9. A deinterleaver module including:
a group of single bit-wide partitioned memory banks receiving respective write address inputs and configured for storing interleaved data as a respective group of successive code word fragments, each code word fragment associated with a prescribed subcarrier frequency and having a prescribed number of code word bits based on a prescribed modulation of the interleaved data, each single bit-wide partitioned memory bank configured for storing a selected bit of a corresponding received code word fragment at a corresponding selected location in response to receiving the corresponding write address input;
a write logic module configured for storing, for each single bit-wide partitioned memory bank, the code word bits for each corresponding code word fragment into the respective selected locations based on supplying a prescribed sequence of address values to the corresponding single bit-wide partitioned memory bank via the corresponding address input, the prescribed sequence of address values selected based on the prescribed modulation and the corresponding prescribed subcarrier frequency, wherein the prescribed sequence of address values are cascaded across the respective single bit-wide partitioned memory banks; and
an output module configured for outputting deinterleaved data from the single bit-wide partitioned memory banks by retrieving, in parallel, code word bits stored at a corresponding selected address for the single bit-wide partitioned memory banks.

10. The deinterleaver module of claim 9, wherein the write logic module includes latch circuit modules for each of the single bit-wide partitioned memory banks, each latch circuit module configured for latching each corresponding code word fragment at a corresponding first clock edge, and successively writing the code word bits for the corresponding code word fragment at respective successive clock edges following the corresponding first clock edge.

11. The deinterleaver module of claim 10, wherein the write logic module further includes a data selection logic module configured for generating bit selection signals for the respective latch circuit modules according to respective selected bit deinterleaving sequences.

12. The deinterleaver module of claim 11, wherein the data selection logic module includes deinterleaving sequence logic configured for selecting, for each code word fragment, the corresponding selected bit deinterleaving sequence based on the prescribed modulation and the corresponding prescribed subcarrier frequency.

13. The deinterleaver module of claim 11, wherein the write logic module further includes a write address logic module configured for selecting, for each code word fragment, the respective selected locations for storage of the code word bits, based on the prescribed modulation, the corresponding prescribed subcarrier frequency, and a prescribed offset relative to each successive group of successive code word fragments.

14. The deinterleaver module of claim 11, wherein the write logic module is configured for causing the concurrent writing of at least two of the code word bits for respective code word fragments into respective at least two of the single bit-wide partitioned memory banks based on the prescribed sequence of address values cascaded across the single bit-wide partitioned memory banks.

15. The deinterleaver of claim 9, wherein the output module is configured for outputting the deinterleaved data for an entire code word, from the single bit-wide partitioned memory banks, within one OFDM symbol time of reception of the interleaved data by the deinterleaver module.

16. The deinterleaver module of claim 9, wherein the write logic module is configured for causing the concurrent writing of at least two of the code word bits for respective code word fragments into respective at least two of the single bit-wide partitioned memory banks based on the prescribed sequence of address values cascaded across the single bit-wide partitioned memory banks.

* * * * *